(12) United States Patent
Takehara et al.

(10) Patent No.: US 6,358,776 B1
(45) Date of Patent: Mar. 19, 2002

(54) METHOD OF FABRICATING AN ELECTRONIC COMPONENT AND APPARATUS USED THEREFOR

(75) Inventors: Masataka Takehara; Osamu Nakagawa, both of Kyoto (JP)

(73) Assignee: Towa Corporation, Kyoto (JP)

( * ) Notice: Subject to any disclaimer, the term of this patent is extended or adjusted under 35 U.S.C. 154(b) by 0 days.

(21) Appl. No.: 09/705,239

(22) Filed: Nov. 2, 2000

(30) Foreign Application Priority Data

Nov. 8, 1999 (JP) .......................................... 11-316209

(51) Int. Cl.[7] .......................... H01L 21/44; H01L 21/48; H01L 21/50

(52) U.S. Cl. ........................ 438/113; 438/114; 438/106; 438/107

(58) Field of Search ................................. 438/460, 113, 438/118, 107, 114, 122, 123, 124, 106, 115, 126, 112, 116

(56) References Cited

U.S. PATENT DOCUMENTS 5,903,044 A * 5/1999 Farnworth et al. .......... 257/620
6,165,815 A * 12/2000 Ball ........................... 438/113
6,180,435 B1 * 1/2001 Ise et al. ..................... 438/113

* cited by examiner

*Primary Examiner*—David Nelms
*Assistant Examiner*—Thao P. Le
(74) *Attorney, Agent, or Firm*—W. F. Fasse; W. G. Fasse

(57) ABSTRACT

The present invention provides a method of fabricating an electronic component, using a tool for pressing a chip against a substrate and heating the same, connecting a chip electrode and a substrate electrode together via a bump, placing the substrate in alignment with a die alignment plane for an upper die and a lower die, clamping the upper die and the lower die to form a cavity and exhausting the cavity via an exhaust hole to evacuate the same, and injecting melted resin into the cavity and curing the melted resin to provide sealing resin. Then, in a predetermined ambient at a predetermined temperature the substrate is pressed against a test board and a predetermined electrical signal is applied from the test board via an external electrode to the chip to test an operation of an electronic component configured on a unit region of the substrate and the chip. Thereafter, cutting along a virtual line completes the electronic component. Thus, a plurality of chips can be resin-sealed collectively with high precision and a plurality of electronic components can be burnt in. As a result, in mounting the chip to the substrate, sealing the same with resin and burning in the same to provide an electronic component, the electronic component can be efficiently fabricated, with the sealing resin having a dimension with high precision.

12 Claims, 4 Drawing Sheets

METHOD OF FABRICATING AN ELECTRONIC COMPONENT AND APPARATUS USED THEREFOR

BACKGROUND OF THE INVENTION

1. Field of the Invention

The present invention relates generally to methods of fabricating an electronic component with a semiconductor chip or a similar chip element (hereinafter referred to as a "chip") mounted on a substrate and apparatuses used therefor, and particularly to methods of efficiently fabricating the electronic component and apparatuses used therefor.

2. Description of the Background Art

An electronic component including a substrate having a plurality of regions each with a chip mounted thereon, is conventionally fabricated through the following process: Initially, at each region a chip is mounted, and an electrode of each chip and that of each region are electrically connected together. Then, a dispenser is used to drop liquefied resin onto each region. Then, the liquified resin is cured to seal the chip on the substrate at each region with the resin. Then, the substrate is cut to provide an electronic component having a single chip resin-sealed at a single region. Finally, a test board is used to provide current conduction through each electronic component placed in a predetermined ambient at a predetermined temperature to burn-in the same and also to conduct an operation test on the same to screen out any defective component and thus obtain good components.

In the above conventional method of fabricating an electronic component, however, to seal with resin a chip on a substrate at each region, liquefied resin is dropped onto each one of chips and cured. This is time consuming and the electronic component is thus fabricated inefficiently.

Furthermore, after the substrate is cut separate electronic components are subjected to burn-in and an operation test. This entails for example the step of transporting the electronic components and attaching and detaching them to and from a socket of a test board and the step of selecting a good electronic component and transporting and placing it on a tray. This also results in an electronic component being fabricated inefficiently.

Furthermore, liquefied resin dropped and cured can disadvantageously have a dimension with low precision if the resin has an insufficiently controlled viscosity or it cures under an insufficiently controlled condition.

SUMMARY OF THE INVENTION

To overcome the above, conventional disadvantages, the present invention contemplates a method of efficiently fabricating an electronic component having a dimension with high precision and an apparatus used therefor.

To achieve the above object, the present invention provides a method of fabricating an electronic component, which generally involves mounting a respective chip on a substrate at each of a plurality of regions, sealing the same with sealing resin and then cutting the substrate to provide the electronic component each including one of the plurality of regions, the chip and the sealing resin. Particularly, the inventive method includes the steps of: placing the respective chip at each of the plurality of regions; electrically connecting together a substrate electrode of each of the plurality of regions and a chip electrode of each chip; applying the sealing resin on the plurality of regions to seal the substrate; before cutting the substrate, applying a predetermined, testing electrical signal via an external electrode provided for each of the plurality of regions for the purpose of allowing the electronic component to externally communicate an electrical signal to test an operation of each electronic component; and thereafter cutting the substrate having the plurality of regions sealed with resin, to separate each of the plurality of regions.

In the present invention, chips can be collectively sealed while a substrate is as it is, i.e., before the substrate is cut. As such, the number of sealing process steps can be reduced. Furthermore, individual electronic components can be tested through conduction while the substrate is as it is. As such, it is not necessary to transport each chip to a test apparatus or attach or detach the chip to and from the test apparatus. As such, the number of the steps for the test can be reduced. Thus, an electronic component can be fabricated in a process with a reduced number of steps and hence efficiently.

The present invention in one embodiment provides the method of fabricating an electronic component, wherein at a testing step the substrate having the plurality of regions sealed is arranged in a predetermined ambient at a predetermined temperature. Since an electrical signal is applied to the external electrode in the predetermined ambient at the predetermined temperature to test an operation of the electronic component, the electronic component can be efficiently burnt in with the substrate as it is.

Furthermore the present invention provides the method of fabricating an electronic component that may further include the step of providing a protruding electrode on the external electrode of the substrate having the plurality of regions sealed. As such, protruding electrodes can be collectively formed on external electrodes of electronic components while the substrate is as it is. As such, the number of the process steps of providing an electronic component with a protruding electrode can be reduced.

Furthermore the present invention in one embodiment provides the method of fabricating an electronic component, wherein the step of using includes placing the substrate in alignment with a die alignment plane of a die set formed of at least two dies facing each other, clamping the die set, and injecting melted resin into a cavity formed by the die set and the substrate and curing the melted resin therein to provide the sealing resin.

In such a step as above, the substrate can have a plurality of regions collectively sealed with resin. As such, it is not necessary to seal each chip individually when each chip is sealed on the substrate at a respective region. As such, the number of sealing steps can be reduced. Furthermore, melted resin can be injected into a cavity of a closed space and cured therein and the sealing resin can thus have a dimension with high precision.

Furthermore the present invention provides the method of fabricating an electronic component, preferably further including the step of vacuuming the cavity, wherein the melted resin is injected into the vacuumed cavity. As such, in collectively sealing the plurality of regions of substrate, a void can be minimized and the melted resin can thus be injected into the entire region of the cavity reliably.

The present invention provides an apparatus used to fabricate an electronic component, generally involving mounting a respective chip on a substrate at a plurality of regions, sealing the same with sealing resin and then cutting the substrate to provide the electronic component respectively including the region, the chip and the sealing resin. The apparatus includes bonding means placing the respective chip on each of the plurality of regions; connection means electrically connecting together a substrate electrode of each region and a chip electrode of each chip; sealing means providing the sealing resin over the plurality of regions; testing means communicating an electrical testing signal to test an operation of each electronic component, the electrical signal being communicated via an external electrode provided at each region to allow the electronic component to externally communicate an electrical signal; and cutting means cutting the substrate having the plurality of regions sealed with the sealing resin, to provide the electronic component being separated.

The present invention in one embodiment provides the apparatus used to fabricate an electronic component, wherein the testing means applies the predetermined electrical signal via the external electrode when the substrate having the plurality of regions sealed with the sealing resin is placed in a predetermined ambient at a predetermined temperature.

Furthermore the present invention provides the apparatus used to fabricate an electronic component that may further include electrode forming means forming a protruding electrode on the external electrode of substrate having the plurality of regions sealed with the sealing resin.

Furthermore the present invention in one embodiment provides the apparatus used to fabricate an electronic component, wherein the sealing means includes: a die set including at least two dies facing each other; and injection means injecting melted resin into a cavity formed by the die set and the substrate aligned with a die alignment plane of the die set.

Furthermore the present invention provides the apparatus used to fabricate an electronic component, wherein preferably the sealing means further includes means vacuuming the cavity.

Configured as described above, the present invention can provide the apparatus used to fabricate an electronic component, to implement the above-described method of fabricating an electronic component in accordance with the present invention.

Thus, in the present invention, sealing each chip with resin one by one can be dispensed with and so can transporting each electronic component to a test apparatus and a burn-in apparatus and attaching and detaching the electronic component to and from such apparatuses. Furthermore, melted resin can cure in the cavity corresponding to a closed space and it can thus have a dimension with high precision to reliably seal chips. Furthermore, the cavity receiving the melted resin can be vacuumed to prevent a void to allow the melted resin to be injected into the entire region of the cavity reliably.

Thus the present invention can provide a superior, practical effect providing an electronic component including sealing resin having a dimension with high precision and a high quality, in a process with a reduced number of steps and hence efficiently.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Reference will now be made to FIGS. 1A to 4B to describe one embodiment of a method of fabricating an electronic component and an apparatus used therefor in accordance with the present invention.

In fabricating an electronic component in one embodiment of the present invention, an unfinished product at each step is as will now be described with reference to FIGS. 1A–2B.

Figure 1A:
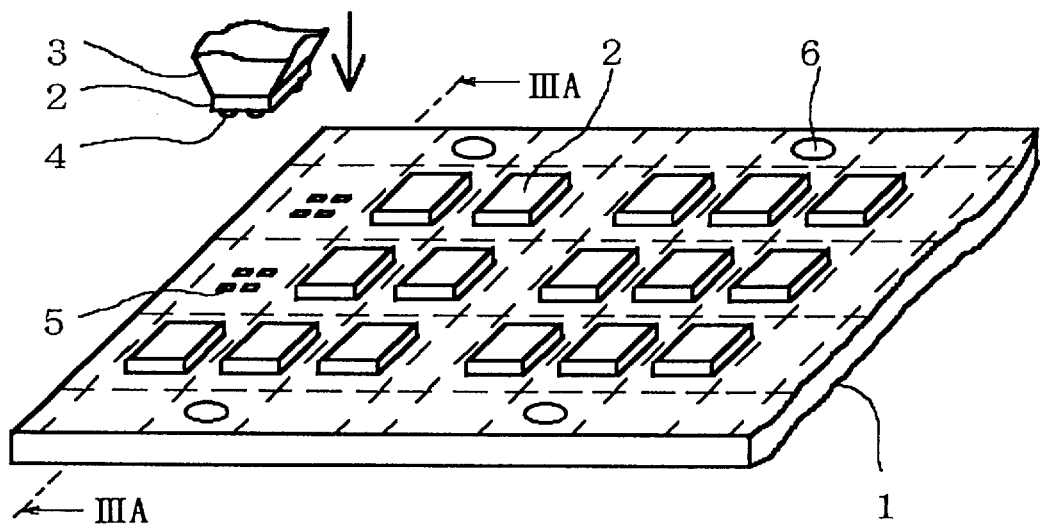
FIGS. 1A, 1B, 1C are perspective views of one embodiment of a method of fabricating an electronic component in accordance with the present invention, showing an unfinished product provided at the steps of mounting and sealing a chip on a substrate with resin, then burning in the same to determine a defective product, and marking with a fail mark the sealing resin covering the defective product.

Initially, as shown in FIG. 1A, a substrate 1 has a chip 2 bonded thereto. In doing so, a bonding tool 3 is used to hold chip 2 while heating it and align with a substrate electrode 5 a bump 4 formed for example of solder and provided on a chip electrode (not shown). Then, tool 3 presses chip 2 against substrate 1, which is aligned on a stage (not shown) by means of a reference hole 6 and, e.g., sucked and thus fixed thereon, and bump 4 is melted and then cures to bond chip 2 to substrate 1.

Figure 1B:
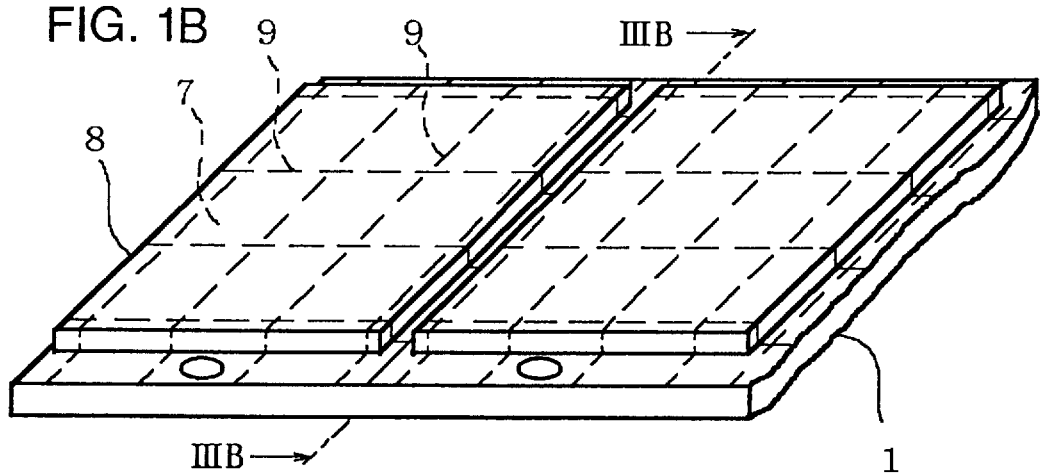

Then, as shown in FIG. 1B, shielding resin 8 is provided on a region corresponding to a set of a plurality of unit regions 7 each corresponding to a single chip 2. In this figure, one segment of sealing resin 8 covers nine unit regions 7. Herein, as will be described hereinafter, in a cavity formed of a clamped die set and substrate 1 melted resin is injected and cured to provide sealing resin 8. A virtual line 9 represents an outer edge of each unit region 7 and hence a line along which the substrate is cut at a subsequent step.

Figure 1C:
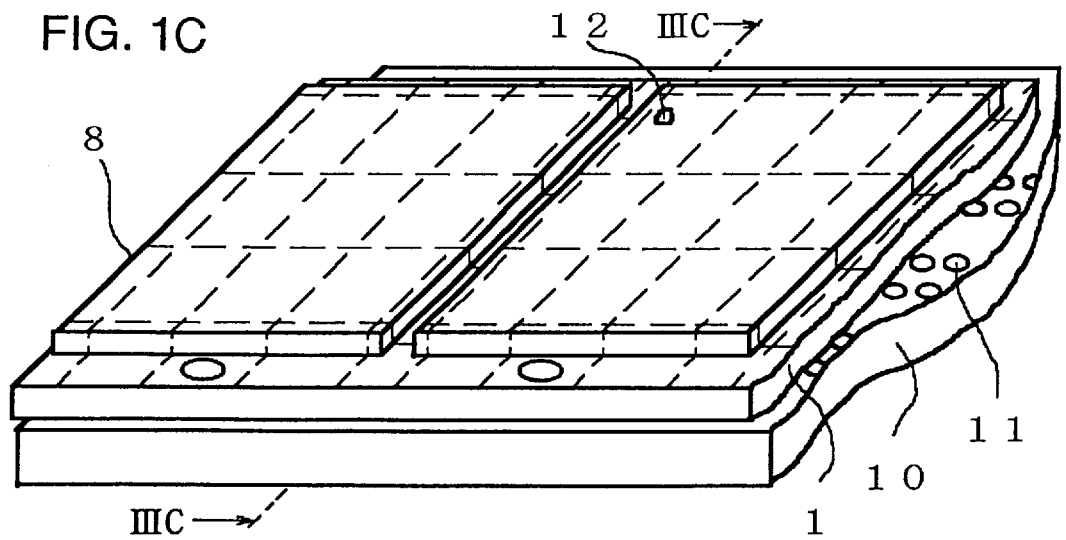

Then, as shown in FIG. 1C, a test board 10 is arranged under and opposite to substrate 1 and substrate 1 is pressed against test board 10. In doing so, an external electrode (not shown) provided on a lower surface of substrate 1 at each unit region 7 to allow an electronic component to externally communicate an electrical signal and a testing electrode 11 of test board 10 are aligned. Then, a test apparatus (not shown) provided external to test board 10 applies a required electrical signal via a predetermined testing electrode 11 to operate chip 2 successively. Furthermore, an electrical signal output from operating chip 2 is input via the predetermined testing electrode 11 to the test apparatus to allow the test apparatus to examine the operation of chip 2, determining whether chip 2 operates normally. If chip 2 is not found to operate normally then sealing resin 8 covering the defective chip 2 is marked with a fail mark 12 indicating that the electronic component including the chip 2 is defective.

Figure 2A:
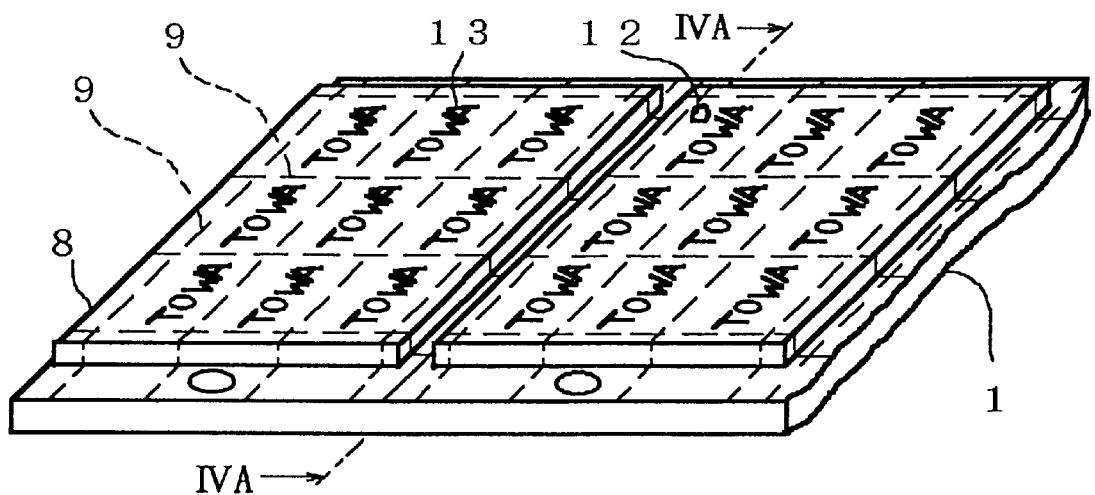
FIGS. 2A and 2B are perspective views of one embodiment of the method of fabricating an electronic component in accordance with the present invention, showing an unfinished product provided at the steps of marking a product mark and cutting the unfinished product to provide separate electronic components.

As shown in FIG. 2A, after sealing resin 8 is marked with fail mark 12, sealing resin 8 is marked with a product mark 13 for each chip. In providing this marking, laser, inkjetting, or the like may be employed, although in the present invention, offset printing, direct printing, screen printing or the like is preferably used to collectively, simultaneously mark a large number of electronic components.

Figure 2B:
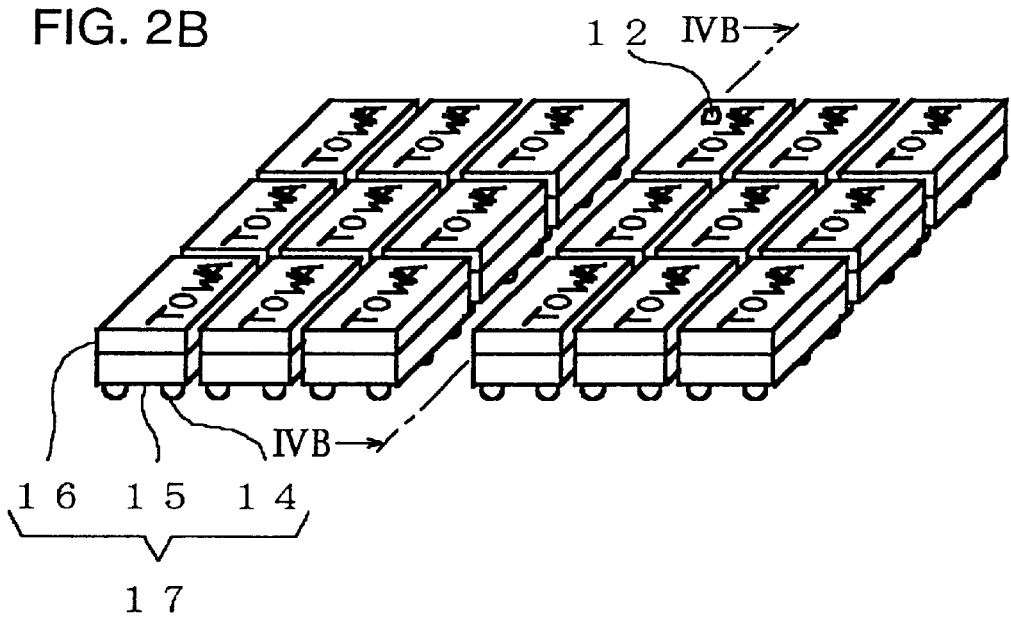
Figure 2C:
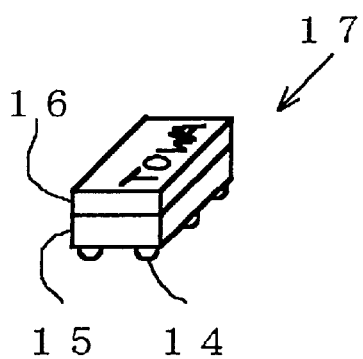
FIG. 2C is a perspective view of a finished electronic component.

Then, as shown in FIG. 2B, a bump 14 formed for example of solder is for example transferred and thus formed on an external electrode (not shown) of substrate 1. Then, the molded medium with chips sealed on substrate 1 with sealing resin 8 is cut along virtual line 9 corresponding to a cutting line. Thus, there can be completed individual electronic components configured of a chip (not shown), an individual substrate 15 having bump 14, and individual resin 16, i.e., a package 17 as shown in FIG. 2C.

Figure 3A:
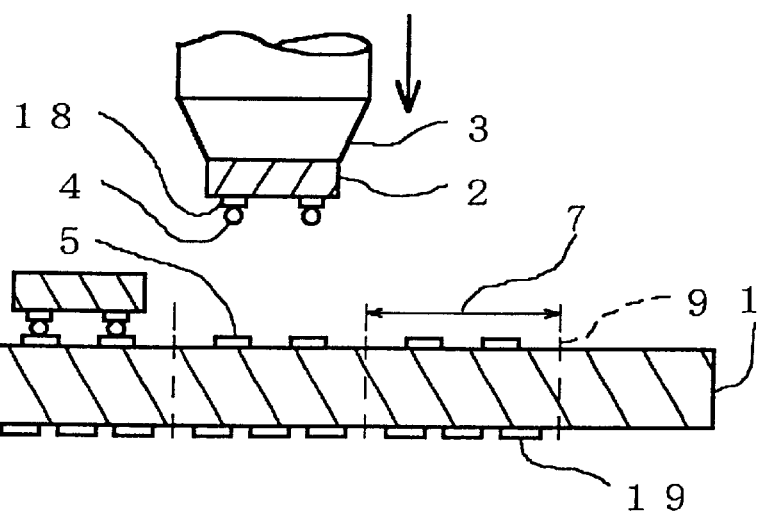
FIGS. 3A, 3B, 3C are cross sections representing the method of fabricating an electronic component in accordance with the present invention taken along the IIIA—IIIA line of FIG. 1A, the IIIB—IIIB line of FIG. 1B, the IIIC—IIIC line of FIG. 1C, respectively, showing from the step of mounting a chip on a substrate to the step of sealing the chip on the substrate with resin.

Reference will now be made to FIGS. 3A to 4B to describe each step of a process for fabricating the electronic component. Initially, as shown in FIG. 3A, tool 3 is used to hold chip 2 and align bump 4 of chip 2 on the chip's electrode 18 with substrate electrode 5 of substrate 1. Chip 2, heated by tool 3, is pressed against substrate 1. Thus, bump 4 is melted and then cured to electrically connect chip electrode 18 and substrate electrode 5 together. The above process is repeated to mount chip 2 to substrate 1 at all unit regions 7 on a surface thereof opposite to that provided with external electrode 19.

Figure 3B:
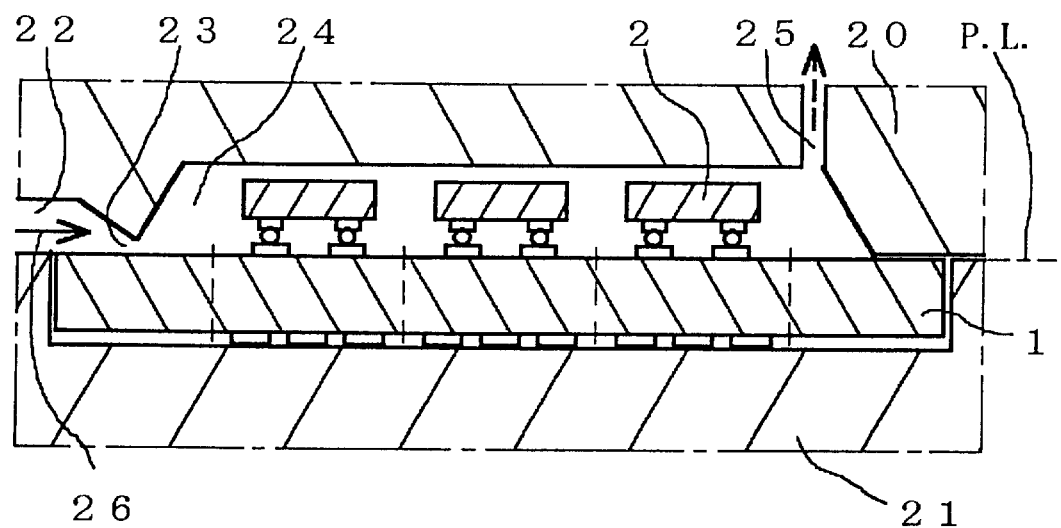

Then, as shown in FIG. 3B, substrate 1 is placed on a lower die 21 facing an upper die 20 and upper die 20 and lower die 21 are then aligned. Upper die 20 and lower die 21 together form a die set and substrate 1 is placed to have its upper surface aligned in the same plane as a die alignment plane P. L. of the die set. The die set clamped and substrate 1 together form a runner portion 22 and a gate portion 23, each passing injected resin, and a cavity 24 corresponding to a space receiving the injected resin.

Upper die 20 is provided with an exhaust tube 25 connected to a pressure reduction mechanism corresponding for example to an exhaust pump (not shown) to exhaust cavity 24, as indicated in the figure by a broken arrow, to allow cavity 24 to have a reduced pressure. Then, melted resin 26 pressurized by a plunger (not shown) is injected into cavity 24, as indicated in the figure by an arrow, and then cures to provide the sealing resin.

Figure 3C:
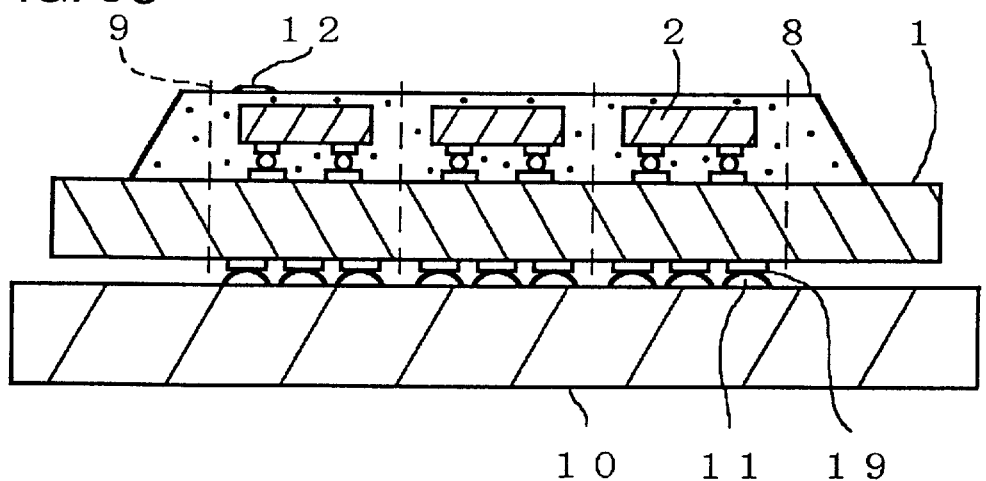

Then, as shown in FIG. 3C, external electrode 19 is brought into contact with testing electrode 11 provided on test board 10. Then, as has been described previously, a test apparatus (not shown) is used to operate chip 2 successively and if chip 2 is not found to operate normally then sealing resin 8 covering the chip 2 is marked with a fail mark 12 indicating that the electronic component including the chip 2 is defective. Thus, electronic components can be tested to determine a defective product.

Furthermore, if in this step substrate 1 with each chip 2 sealed with resin is placed in a predetermined ambient at a predetermined temperature, a test apparatus can apply a required electrical signal via a predetermined testing electrode 11 to successively operate each chip 2 to burn in the same.

Figure 4A:
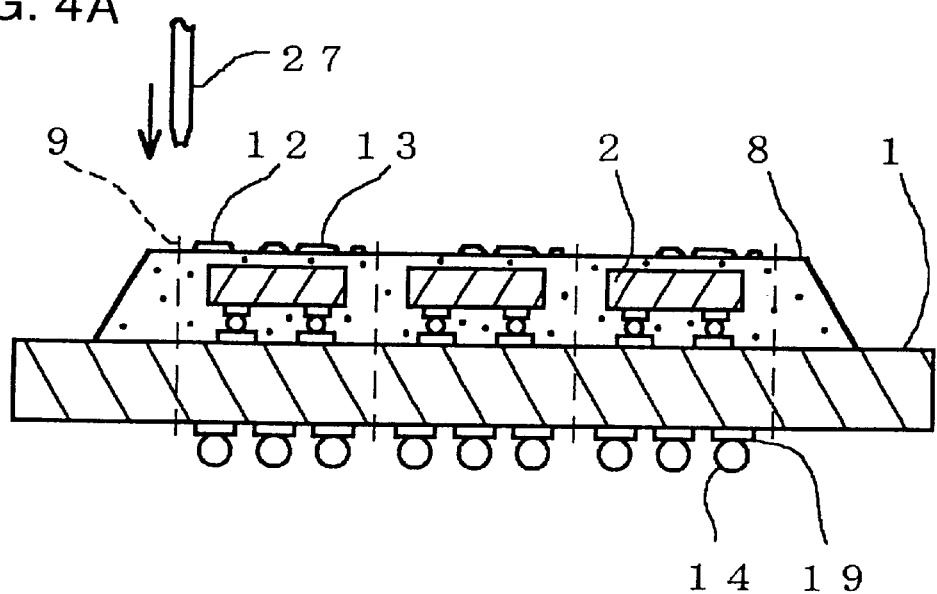
FIGS. 4A and 4B are cross sections representing the method of fabricating an electronic component in accordance with the present invention taken along the IVA—IVA line of FIG. 2A and the IVB—IVB line of FIG. 2B, respectively, showing from the step of burning in a chip sealed with resin to the step of cutting the substrate to provide a separate electronic component.

Then, as shown in FIG. 4A, product mark 13 is provided on a surface of sealing resin 8 corresponding to each chip 2.

Figure 4B:
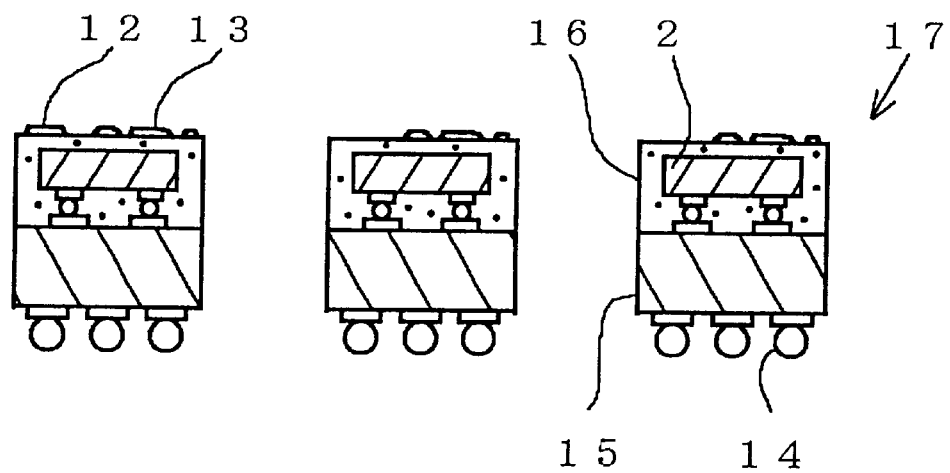

Then, a transfer apparatus or the like is used to provide external electrode 19 with bump 14 formed for example of solder and corresponding to a protruding electrode in accordance with the present invention. Then, a blade 27 is used to cut along virtual line 9 substrate 1 integrated with sealing resin 8. Thus, as shown in FIG. 4B, there can be completed individual electronic components configured of chip 2, individual substrate 15 having bump 14, and individual resin 16, i.e., package 17.

Furthermore, finished products or packages 17 are all transported onto a tray collectively and used in the step of mounting the same to a printed board or the like. This step uses a mounter employing an image process to recognize fail mark 12 to prevent an electronic component including a defective chip from being mounted to a printed board or the like. This eliminates the necessity of providing the step of selecting only good package 17 and transporting the same onto a tray.

In the present invention, as has been described above, substrate 1 having a plurality of unit regions 7 is sealed collectively and individual electronic components are subjected to conduction and thus tested while substrate 1 is as it is, i.e., before substrate 1 is cut. This eliminates the necessity of providing the step of sealing each chip 2 with resin one by one and that of transporting each electronic component to a test apparatus and attaching and detaching the electronic component to and from the test apparatus. As such, the number of process steps can be reduced to fabricate electronic components efficiently.

Furthermore, if substrate 1 is placed in a predetermined ambient at a predetermined temperature, individual electronic components can be collectively burnt in. This eliminates the necessity of providing the step of each electronic component to a burn-in apparatus and that of attaching and detaching the electronic component to and from the apparatus. Thus, the number of process steps can be reduced to fabricate electronic components efficiently.

Furthermore, bumps 14 can be collectively provided on external electrodes 19 of substrate 1 as it is. This can eliminate the step of providing package 17, i.e., an electronic component with bump 14.

Furthermore, substrate 1 aligned with die alignment plane P.L. of a die set and the die set clamped together form cavity 24 into which melted resin 26 is injected and cured to collectively seal a plurality of unit regions 7 of substrate 1. This can eliminate the necessity of providing the step of sealing each chip 2 individually. Thus the number of the sealing steps can be reduced. Furthermore, the melted resin injected and cured in cavity 24 corresponding to a closed space can have a dimension with high precision to reliably seal a product.

Furthermore, injecting melted resin 26 into cavity 24 having an internal reduced pressure allows melted resin 26 to be reliably injected into the entirety of cavity 24 while preventing a void from occurring when the plurality of unit regions 7 of substrate 1 are collectively shielded.

While in the present embodiment chip electrode 18 and substrate electrode 5 are connected together by bump 4 provided on chip 2, they may be connected together alternatively by a bump provided on substrate electrode 5.

Furthermore, while chip 2 and substrate 1 have their respective electrodes connected together by bump 4, they may have their respective electrodes wire-bonded together.

Furthermore, while blade 27 is used to cut substrate 1 integrated with sealing resin 8, laser may be alternatively used to cut the same.

Furthermore, while bump 14 is provided after an electronic component is tested, bump 14 may be provided before an electronic component is tested. Furthermore, the present invention is also applicable to an electronic component excluding bump 14.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating an electronic component, mounting a chip on a substrate at each of a plurality of regions, sealing the same with sealing resin and then cutting said substrate to provide said electronic component each including one of said plurality of regions, said chip and said sealing resin, comprising the steps of:

placing said chip at each of said plurality of regions;

electrically connecting together a substrate electrode of each of said plurality of regions and a chip electrode of each said chip;

applying said sealing resin on a said plurality of regions to seal said substrate;

before cutting said substrate, applying a predetermined, testing electrical signal via an external electrode provided for each of said plurality of regions for a purpose of allowing said electronic component to externally communicate an electrical signal to test an operation of each said electronic component; and cutting said substrate having said plurality of regions sealed with resin, to separate each of said plurality of regions.

2. The method of claim 1, wherein said step of applying includes placing in a predetermined ambient at a predetermined temperature said substrate having said plurality of regions sealed with resin.

3. The method of claim 1, further comprising the step of providing a protruding electrode on each said external electrode of said substrate having said plurality of regions sealed with resin.

4. The method of claim 1, wherein said step of applying includes placing said substrate in alignment with a die alignment plane of a die set formed of at least two dies facing each other, clamping said die set, and injecting melted resin into a cavity formed by said die set and said substrate and curing the melted resin therein to provide said sealing resin.

5. The method of claim 4, further comprising the step of vacuuming said cavity, wherein said melted resin is injected into said cavity after said vacuuming.

6. An apparatus used to fabricate an electronic component, mounting a chip on a substrate at a plurality of regions, sealing the same with sealing resin and then cutting said substrate to provide said electronic component including each said region, said chip and said sealing resin, comprising:

bonding means for placing said chip on each of said plurality of regions;

connection means for electrically connecting together a substrate electrode of said each region and a chip electrode of each said chip;

sealing means for applying said sealing resin over said plurality of regions;

testing means for communicating a testing, electrical signal to test an operation of each said electronic component, said electrical signal being communicated via an external electrode provided at each said region to allow said electronic component to externally communicate an electrical signal; and cutting means for cutting said substrate having said plurality of regions sealed with said sealing resin, to provide said electronic component separated.

7. The apparatus of claim 6, wherein said testing means applies said predetermined electrical signal via said external electrode when said substrate having said plurality of regions sealed with said sealing resin is placed in a predetermined ambient at a predetermined temperature.

8. The apparatus of claim 6, further comprising electrode forming means forming a protruding electrode on said external electrode of substrate having said plurality of regions sealed with said sealing resin.

9. The apparatus of claim 6, wherein said sealing means includes:

a die set including at least two dies facing each other; and injection means injecting melted resin into a cavity formed by said die set and said substrate aligned with a die alignment plane of said die set.

10. The apparatus of claim 9, wherein said sealing means further includes vacuum means vacuuming said cavity.

11. A method of fabricating electronic components, comprising the steps:

placing a plurality of chips respectively at a plurality of regions on a substrate;

electrically connecting respectively together a respective substrate electrode of each one of said regions and a respective chip electrode of each one of said chips;

applying a sealing resin on said plurality of regions to seal said chips on said substrate;

testing an operation of each one of said chips respectively by applying a predetermined electrical testing signal via a respective external electrode provided for each one of said regions and allowing respectively each one of said chips to externally communicate an electrical signal; and after said step of testing an operation of each one of said chips, cutting said substrate respectively between said regions that respectively have said chips thereon and that have been sealed with said resin, to separate said regions from each other, and thereby forming plural electronic components that each respectively include one of said chips sealed with said resin on one of said regions of said substrate.

12. The method according to claim 11, further comprising applying markings to said sealing resin before said step of cutting.

\* \* \* \* \*